United States Patent [19]

Kobayashi et al.

[11] Patent Number: 5,130,862
[45] Date of Patent: Jul. 14, 1992

[54] CODING APPARATUS FOR CONVERTING DIGITAL SIGNALS INTO TERNARY SIGNALS WHOSE DC COMPONENT IS EQUAL TO ZERO

[75] Inventors: Masaaki Kobayashi, Kawanishi; Yoshitomi Nagaoka, Neyagawa; Masafumi Shimotashiro, Neyagawa; Toyohiko Matsuda, Neyagawa, all of Japan

[73] Assignee: Matsushita Electric Industrial Co., Ltd., Osaka, Japan

[21] Appl. No.: 560,271

[22] Filed: Jul. 26, 1990

Related U.S. Application Data

[63] Continuation of Ser. No. 277,193, Nov. 29, 1988, abandoned.

[30] Foreign Application Priority Data

Dec. 1, 1987 [JP] Japan .............................. 62-305052
Feb. 19, 1988 [JP] Japan .............................. 63-38173

[51] Int. Cl.$^5$ .......................... G11B 5/09; H04B 1/62
[52] U.S. Cl. ........................................ 360/40; 375/18
[58] Field of Search .......................................... 360/40

[56] References Cited

U.S. PATENT DOCUMENTS 4,584,690 4/1986 Cafiero et al. ..................... 360/48

OTHER PUBLICATIONS

IEEE Transactions on Communications, vol. 35, No. 2, Feb. 1987, New York, NY, US; K. Y. Kim et al.; "Run-- length limited variants of duobinary and modified duobinary", pp. 142-150.
Patent Abstracts of Japan, vol. 6, No. 115 (E-115) [993], Jun. 26, 1982; & JP-A-57 42 249 (Nippon Denshin Denwa Kosha) Sep. 3, 1982.
Journal of the Institution of Electronic and Radio Engineers, vol. 56, No. 4, Apr. 1986, pp. 159-168, London, GB; F. C. Court: "Minimum bandwidth dicode signalling".
Attach. A-"Principles of Data Communication"; R. W. Lucky et al., Bell Telephone Laboratories, Inc. McGraw-Hill Book Co., pp. 80-92 and pp. 219-221.
Attach. B-"Data Transmission", William R. Bennett et al., McGraw-Hill Book Co., pp. 26-29; 120-127; 132-133.

Primary Examiner—Vincent P. Canney
Attorney, Agent, or Firm—Wenderoth, Lind & Ponack

[57] ABSTRACT

By transforming a duobinary signal, a value of −1 cannot appear again after a value of zero following −1 as shown in a string of −1→0→−1 and a value of 1 cannot appear again after a value of zero following 1 as shown in a string of 1→0→1. Narrow-band transmission is made possible by the fact that the direct current (DC) component of a duobinary signal can be eliminated and reproducible original information can be recorded by discriminating its even level as a one (1) and its odd level as zero (0). Since the DC component can be eliminated, electromagnetic conversion systems are subjected to less distortion, leading to a reduction in the probability of coding errors.

2 Claims, 2 Drawing Sheets

FIG. 1
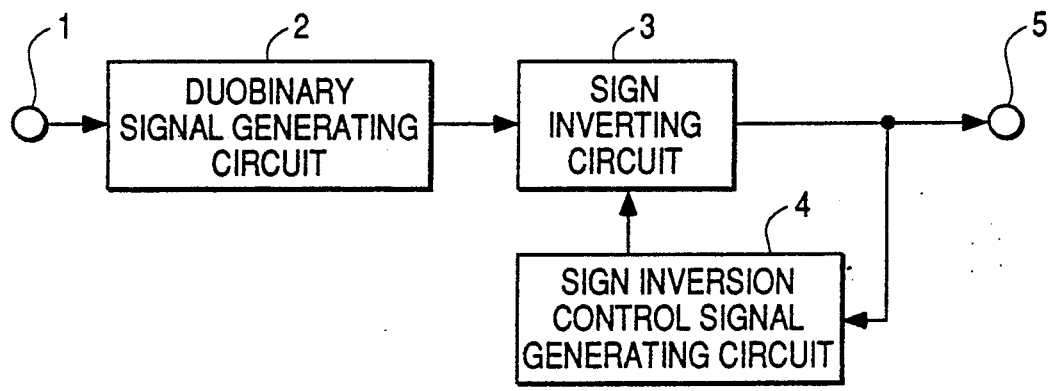
FIG. 2(a)
FIG. 2(b)
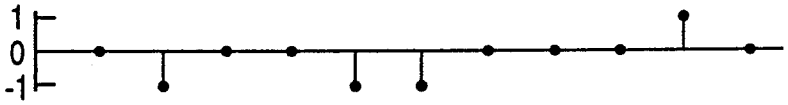
FIG. 2(c)
FIG. 2(d)
FIG. 3
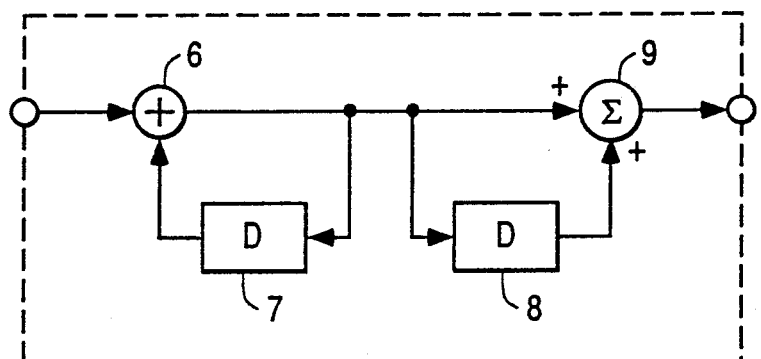

CODING APPARATUS FOR CONVERTING DIGITAL SIGNALS INTO TERNARY SIGNALS WHOSE DC COMPONENT IS EQUAL TO ZERO

This application is a continuation of now abandoned application, Ser. No. 07/277,193 filed on Nov. 29, 1988.

BACKGROUND OF THE INVENTION

1. Field of the Invention

This invention relates to a coding apparatus for coding digital signals and a magnetic recording system using the same.

2. Description of the Prior Art

As one of the codes used for coding digital signals, a correlative code is available. The system using this code transmits information of one time slot as a multi-value signal distributed over a plurality of time slots.

Since the information is received as a multi-valued signal, the transmission of information can be effected with a narrower frequency band as compared with systems in which the signal is a binary signal (such as, for example, an NRZ system). In order to transmit information at a narrower frequency band using the correlative code, however, the number of multi-value levels increases unavoidably, so that there exists a problem in that the SN ratio of the transmission line must be improved. In addition, since the above-mentioned correlative code contains a DC component, when the code must be recorded using a magnetic recording system, there arises a problem in that the magnetic recording system is not suited for recording such a code because a magnetic recording system has difficulty in recording DC transmissions.

SUMMARY OF THE INVENTION

An object of this invention is to provide a coding apparatus for converting digital signals to ternary signals whose DC component becomes equal to zero and yet whose transmission is possible at a narrow frequency band.

Another object of this invention is to provide a magnetic recording system using the coding apparatus.

A coding apparatus in accordance with this invention comprises a signal generating circuit for generating a duobinary signal corresponding to one kind of correlative code, a sign inverting circuit, and a sign inversion control signal generating circuit. An output signal of the signal generating circuit is supplied to the sign inverting circuit and sign inversion control signal generating circuit. The sign inverting circuit is controlled by the output signal of the sign inversion control signal generating circuit so that the mean value of a signal string outputted from the signal generating circuit becomes zero.

A magnetic recording system in accordance with this invention is structured such that an output signal of the above-mentioned sign inverting circuit is supplied through a recording amplifier to a recording head to be stored on a magnetic recording medium.

Since an apparatus in accordance with this invention produces a signal which is a ternary signal similar to the duobinary signal and yet has a DC component which is equal to zero, the transmission can be carried out at a narrower frequency band than that when a duobinary signal is used. Thus, a coding apparatus in accordance with this invention may be easily introduced into systems such as, for example, a tape-head system of a video-tape recorder or a disk-head system of a floppy disk or hard disk drive, which cannot easily store a direct current signal.

BRIEF DESCRIPTION OF THE DRAWINGS

FIG. 1 is a block diagram showing a structure of a coding apparatus in accordance with an embodiment of this invention.

FIGS. 2(a) to (d) are signal waveform diagrams showing waveforms at representative points of the structures shown in FIG. 1, FIG. 3 and FIG. 4.

FIG. 3 is a block diagram showing an example of the duobinary signal generating circuit shown in FIG. 1.

DESCRIPTION OF THE PREFERRED EMBODIMENTS

Figure 4:
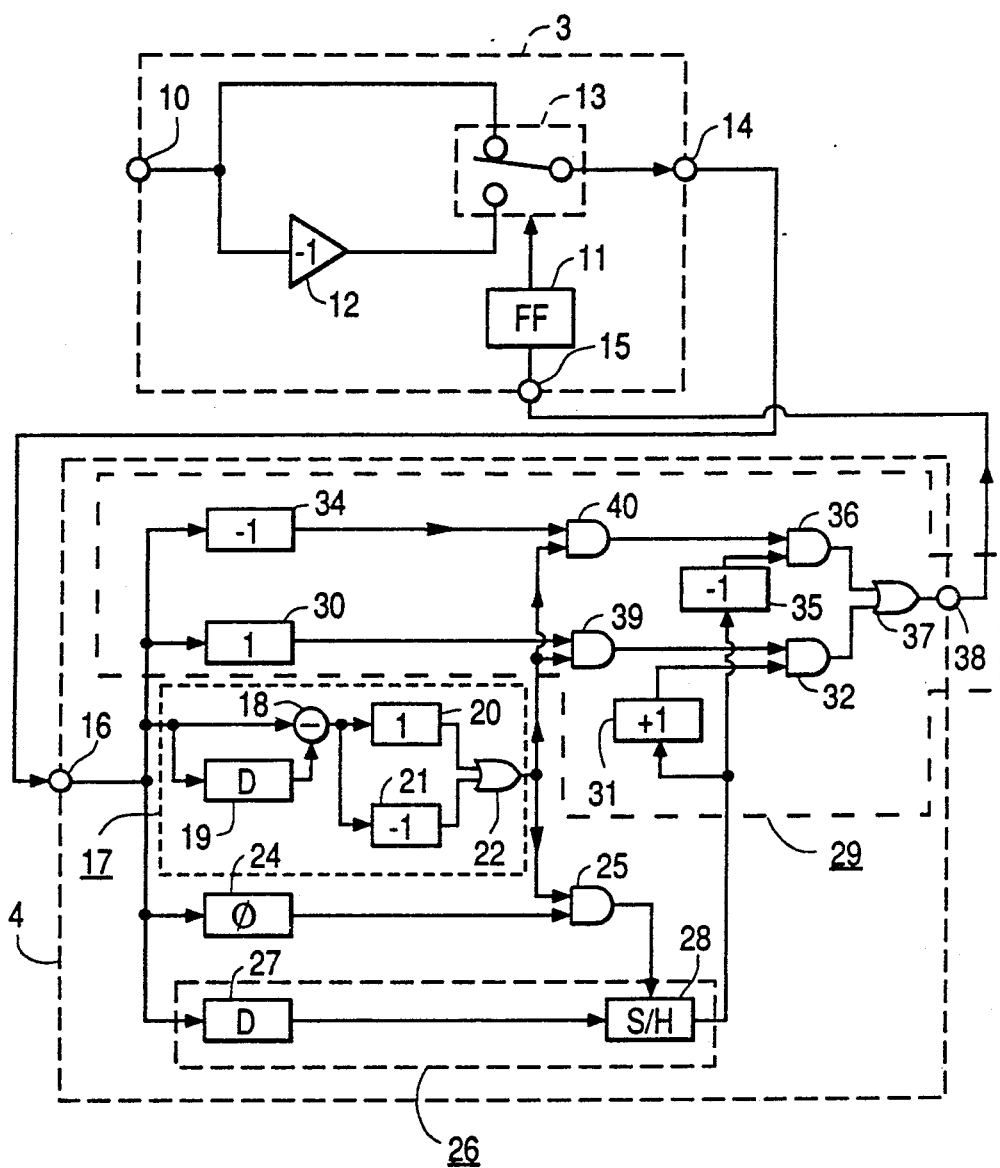
FIG. 4 is a block diagram showing an example of the sign inverting circuit and sign inversion control signal generating circuit shown in FIG. 1.

FIG. 1 shows a block diagram of a coding apparatus in accordance with an embodiment of this invention. FIGS. 2(a) to (d) show signal waveforms for explaining of the apparatus shown in FIG. 1. FIG. 2(a) shows a waveform of a signal inputted into an input terminal 1. This input signal is supplied to a duobinary signal generating circuit 2. The duobinary signal generating circuit 2 is well known and consists, for example, as shown in FIG. 3, of a modulo-two adder 6, delay circuits 7 and 8, and an algebratic summing circuit 9. In addition, the modulo-two adder 6 and the delay circuit 7 constitutes a precoder. The output signal thereof (an output signal of the module-two adder 6) is shown in FIG. 2(b). The operation of the duobinary signal generating circuit 2 is described, for example, in Sanpo-Shuppan's "Technology of PCM Communications" (by Hisashi Kaneko), p. 79 or "IEEE Transactions on Communication Technology," FEB., 1966, pp. 67–68. FIG. 2(c) shows a waveform of an output signal of said duobinary signal generating circuit 2. This is the generally called a duobinary signal. In an electromagnetic converting system of a magnetic recording and reproducing apparatus whose code transmission line includes a tape-head and the like, if a signal has a direct current component, then the waveform of a signal to be reproduced will cause an increased distortion, resulting in an increase in the probability of coding errors. As explained below, the sign inverting circuit 3 and the sign inversion control signal generating circuit 4 of the coding apparatus of this invention are structured such that if a value of '0' appears once (or appears continuously) after a string of '0'→'1' (or after a string of '0'→a continuous appearance of '1'), and then a value of '−1' appears successively after the appearance of '0' (or after the completion of the continuous appearance of '0'), then the input value ('−1') is outputted as is, and if a value of '1' appears instead of '−1', then the input value ('1') is outputted after it has been sign-inverted to '−1'.

Concrete examples of the sign inverting circuit 3 and sign inversion control signal generating circuit 4 in FIG. 1 are shown in FIG. 4. In FIG. 4, the sign inverting circuit 3 comprises an input terminal 10 for inputting a duobinary signal, a switch 13, a polarity inverting circuit 12, a flip-flop circuit 11, an output terminal 14 and an input terminal 15 for inputting an inversion pulse. The sign inversion control signal generating circuit 4 comprises an input terminal 16 which is to be connected to the above-mentioned output terminal 14, a preceding value comparator 17 for determining that there has been a change in a signal level from a preceding value to a present value, a zero detection circuit 24 for detecting that the present value is zero, an AND circuit 25 for obtaining a logical product of the output of the preceding value comparator 17 and the output of the zero detection circuit 24, a memory circuit 26 for storing the preceding value when the present value has changed from the preceding value and the present value is '0', a coincidence detecting circuit 29 for detecting that the present value of an input signal is a value other than '0' and is coincident with the output signal of the memory circuit 26, and an output terminal 38 for outputting an inversion pulse (p). The preceding value comparator 17 comprises, for example, a subtracter 18, a delay circuit 19, a '1' detecting circuit 20, a '−1' detecting circuit 21, and an OR circuit 22. The memory circuit 26 comprises a delay circuit 27 and a sample-hold circuit 28. The coincidence detecting circuit 29 comprises '−1' detecting circuits 34 and 35, '1' detecting circuits 30 and 31, AND circuits 32, 36, 39 and 40, and an OR circuit 37. In addition, each of the delay circuits 19 and 27 is made, for example, of a D flip-flop and delays an input signal string by one time-slot. The '1' detecting circuits 20, 30 and 31 are each a well-known level comparator. The '−1' detecting circuits 21, 34, 35 and the '0' detecting circuit 24 are each a well-known level comparator.

Through the sign inverting circuit 3 and the sign inversion control signal generating circuit 4 structured as above, the duobinary signal supplied to the input terminal 14 is subjected to a transformation to an output signal string as shown in FIG. 2(d). The output signal string shown FIG. 2(d) is outputted in conformity with the above-mentioned rule, that is, if a value of '0' appears once (or appears continuously) following a string of '0'→'1' (or following a string of '0'→ a continuous appearance of '1'), and then a value of '−1' appears successively after the appearance of '0' (or after the completion of the continuous appearance of '0'), then the input value ('−1') is outputted as is, and if a value of '1' appears instead of '−1', then the input value ('1') is outputted after it has been sign-inverted to '−1'. Based on the same rule as above, when a value of '0' appears following a string of '0'→'−1' and then '1' appears successively thereafter, the input value is outputted as is, and if a value of '−1' appears instead of '1', the input value is outputted after it has been sign-inverted to '1'. Therefore, the DC component thereof becomes approximately zero when considered in terms of the mean value with respect to time.

Also, a coding apparatus of this invention is not limited to the apparatus shown in FIG. 1, and the duobinary signal can have its waveform changed in such a way that when a value of '0' appears once (or appears continuously following '1' (or following a completion of a continuous appearance of '1'), and then a value of '−1' appears successively after the appearance of '0' (or after the completion of the continuous appearance of '0'), then the input value ('−1') is outputted as is, and if a value of '1' appears instead of '−1', then the input value ('1') is outputted after it has been sign-inverted to '−1'. Similarly, when a value of '0' appears once (or appears continuously) following '−1' (or following a completion of a continuous appearance of '−1'), and then a value of '1' appears successively after the appearance of '0' (or after the completion of the continuous appearance of '0'), then the input value ('1') is outputted as is, and if a value of '−1' appears instead of '1', then the input value ('−1') is outputted after it has been sign-inverted to '−1'.

In another embodiment of a coding apparatus of this invention, with reference to FIG. 1, an output signal of the duobinary signal generating circuit 2 is input to the sign inversion control signal generating circuit 4 instead of to the sign inverting circuit 3, and the sign inverting circuit 3 is controlled by the output signal of the sign inversion control signal generating circuit 4, thereby transforming the duobinary signal in accordance with the above-mentioned rule.

Figure 5:
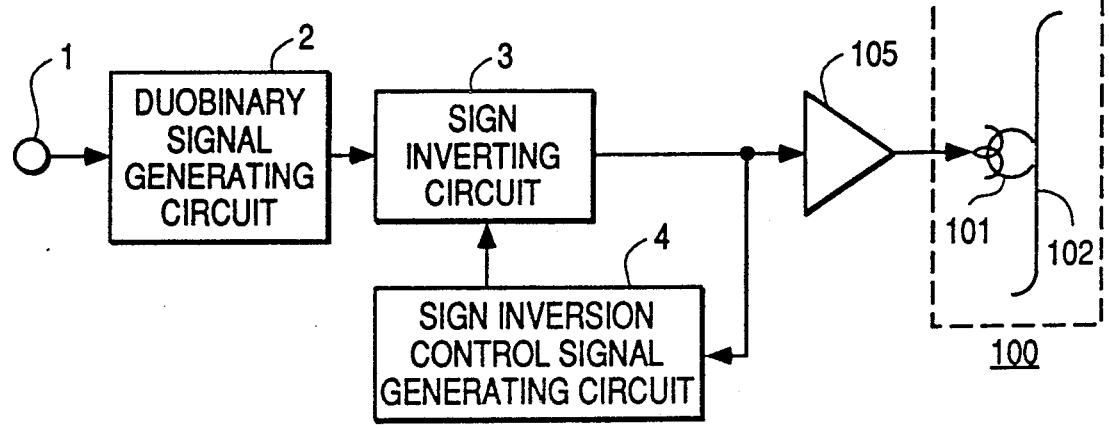
FIG. 5 is a block diagram showing a structure of a magnetic recording system in accordance with an embodiment of this invention.

A magnetic recording system of this invention is structured such that a signal string obtained as shown noted above is supplied through a recording amplifier 105 to a tape-head system 100 as shown in FIG. 5. The tape-head system 100 comprises a magnetic head 101 and a magnetic tape 102. Concretely, the tape-head system 100 can be of a type such as, for example, the helical scanning type used in home VCR's. In addition, other magnetic recording media such as, for example, magnetic disks can be used instead of the magnetic tape 102 for recording.

What is claimed is:

1. A coding apparatus comprising:
   a duobinary signal generating means for converting an input digital signal into a duobinary signal;
   a sign inverting means for selectively inverting the sign of said duobinary signal; and
   a control means for controlling the sign inverting operation of said sign inverting means so as to make the mean value of an output signal string of said sign inverting means equal to zero in accordance with the sequence of said duobinary signal; wherein said control means comprises:
   a code value storing means for storing the preceding code value of said duobinary signal before changing from either a positive or negative value to a zero value;
   a timing detection means for detecting a timing at which the code value of said duobinary signal is changed from a zero value to either a positive or negative value; and
   a coincidence detecting means for detecting coincidence of the code value changed in said timing with the code value stored in said code value storing means;
   wherein when said coincidence detecting means detects a coincidence, said sign inverting means inverts the sign of said duobinary signal and outputs it, and otherwise, said sign converting means outputs said duobinary signal as is without a sign inversion.

2. A magnetic recording system comprising:
   a duobinary signal generating means for converting an input digital signal into a duobinary signal;
   a sign inverting means for selectively inverting the sign of said duobinary signal;
   a control means for controlling the sign inverting operation of said sign inverting means so as to make the mean value of an output signal string of said sign inverting means equal to zero in accordance with the sequence of said duobinary signal; and
   a recording means for recording the output of said sign inverting means on a magnetic recording medium; wherein said control means comprises:

a code value storing means for storing the preceding code value of said duobinary signal before changing from either a positive or negative value to a zero value;

a timing detection means for detecting a timing at which the code value of said duobinary signal is changed from a zero value to either a positive or negative value; and a coincidence detecting means for detecting coincidence of the code value changed in said timing with the code value stored in said code value storing means;

wherein when said coincidence detecting means detects a coincidence, said sign inverting means inverts the sign of said duobinary signal and outputs it, and otherwise, said sign inverting means outputs said duobinary signal as is a without sign inversion.

* * * * *